United States Patent
Vedula et al.

(10) Patent No.: US 10,475,816 B2
(45) Date of Patent: Nov. 12, 2019

(54) BODY CURRENT BYPASS RESISTOR

(71) Applicant: QUALCOMM Incorporated, San Diego, CA (US)

(72) Inventors: Ravi Pramod Kumar Vedula, San Diego, CA (US); Sinan Goktepeli, San Diego, CA (US); Jarred Moore, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/000,501

(22) Filed: Jun. 5, 2018

(65) Prior Publication Data

US 2019/0109152 A1    Apr. 11, 2019

Related U.S. Application Data

(60) Provisional application No. 62/569,435, filed on Oct. 6, 2017, provisional application No. 62/569,816, filed on Oct. 9, 2017.

(51) Int. Cl.
*H01L 27/12* (2006.01)
*H01L 23/66* (2006.01)
*H01L 29/06* (2006.01)

(52) U.S. Cl.
CPC .......... *H01L 27/1203* (2013.01); *H01L 23/66* (2013.01); *H01L 29/0649* (2013.01); *H01L 2223/6677* (2013.01)

(58) Field of Classification Search
CPC . H01L 27/1203; H01L 27/0629; H01L 23/66; H01L 29/0649; H01L 29/78615

USPC .................................................. 327/534–537
See application file for complete search history.

(56) References Cited

U.S. PATENT DOCUMENTS

| | | |
|---|---|---|
| 5,753,955 A | 5/1998 | Fechner |
| 6,521,948 B2 | 2/2003 | Ebina |
| 9,406,695 B2 | 8/2016 | Shapiro et al. |
| 2014/0009212 A1 | 1/2014 | Altunkilic et al. |
| 2015/0070075 A1 | 3/2015 | Keane et al. |
| 2015/0145052 A1* | 5/2015 | Shapiro ................. H01L 27/027 257/352 |
| 2016/0043710 A1 | 2/2016 | Crandall et al. |
| 2016/0261262 A1* | 9/2016 | Aubain ................ H03K 17/162 |

FOREIGN PATENT DOCUMENTS

CN     106230418 A    12/2016

OTHER PUBLICATIONS

International Search Report and Written Opinion—PCT/US2018/048617—ISA/EPO—dated Nov. 12, 2018.

* cited by examiner

*Primary Examiner* — Tomi Skibinski
(74) *Attorney, Agent, or Firm* — Qualcomm Incorporated/Seyfarth Shaw LLP

(57) ABSTRACT

A radio frequency integrated circuit (RFIC) is described. The RFIC includes a switch field effect transistor (FET), including a source region, a drain region, a body region, and a gate. The RFIC also includes a body bypass resistor coupled between the gate and the body region. The RFIC further includes a gate isolation resistor coupled between the gate and the body region. The RFIC also includes a diode coupled between the body bypass resistor and the gate isolation resistor.

18 Claims, 7 Drawing Sheets

BODY CURRENT BYPASS RESISTOR

CROSS-REFERENCE TO RELATED APPLICATIONS

This application claims the benefit of U.S. Provisional Patent Application No. 62/569,435, filed on Oct. 6, 2017, entitled "BODY CURRENT BYPASS RESISTOR," and U.S. Provisional Patent Application No. 62/569,816, filed on Oct. 9, 2017, entitled "BODY CURRENT BYPASS RESISTOR," the disclosures of which are expressly incorporated by reference herein in their entireties.

TECHNICAL FIELD

The present disclosure generally relates to integrated circuits (ICs). More specifically, the present disclosure relates to a body current bypass resistor for improving a breakdown voltage and harmonic performance.

BACKGROUND

The design complexity of mobile radio frequency (RF) chips (e.g., mobile RF transceivers) is complicated by added circuit functions for supporting communication enhancements. Designing mobile RF transceivers may include using semiconductor on insulator technology. Semiconductor on insulator (SOI) technology replaces conventional semiconductor (e.g., silicon) substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on the SOI layer and an SOI substrate supporting the BOX layer.

For example, high performance complementary metal oxide semiconductor (CMOS) radio frequency (RF) switch technologies are currently manufactured using SOI substrates. While SOI substrates may provide some protection against out-of-band harmonics in RF transceivers, there is a need for increasing device isolation and reducing RF loss. Furthermore, a transistor fabricated using SOI technology may suffer from the floating body effect, in which the transistor's body collects charge generated at the junctions of the transistor device.

SUMMARY

A radio frequency integrated circuit (RFIC) is described. The RFIC includes a switch field effect transistor (FET), including a source region, a drain region, a body region, and a gate. The RFIC also includes a body bypass resistor coupled between the gate and the body region. The RFIC further includes a gate isolation resistor coupled between the gate and the body region. The RFIC also includes a diode coupled between the body bypass resistor and the gate isolation resistor.

A method of constructing an radio frequency (RF) integrated circuit having a switch field effect transistor (FET) is described. The method includes tying a gate to a body region of the switch FET. The method also includes fabricating a body bypass resistor between the gate and the body region. The method further includes fabricating a gate isolation resistor between the gate and the body region.

A radio frequency integrated circuit (RFIC) is described. The RFIC includes a switch field effect transistor (FET), having a source region, a drain region, a body region, and a gate. The body region is tied to the gate. The RFIC also includes means for isolating the gate from a body current of the body region. The RFIC further includes means for directing the body current from the body region away from the gate of the switch FET. The RFIC also includes a diode coupled between the means for isolating and the means for directing This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
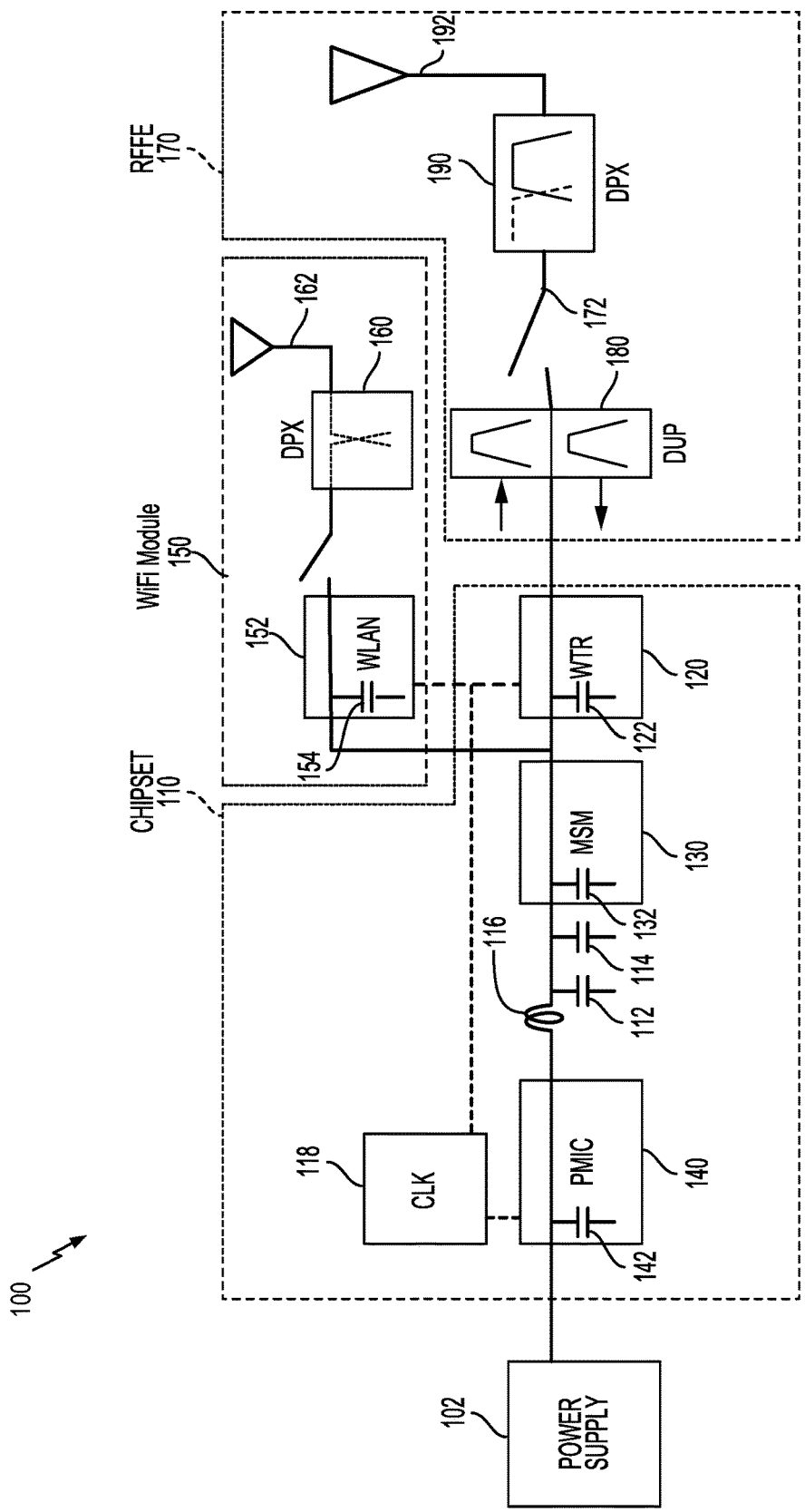
FIG. 1 is a schematic diagram of a wireless device having a wireless local area network module and a radio frequency (RF) front end module for a chipset.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers may include using semiconductor on insulator technology. Semiconductor on insulator (SOI) technology replaces conventional silicon substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer.

For example, a thickness of the BOX layer determines a distance between the active devices and an SOI substrate separated from the active devices by the BOX layer. A sufficient distance between the active device and the SOI substrate is important for improving active device performance. Reducing device footprints for meeting specifications of future processes nodes, however, reduces a thickness of the BOX layer, which defines the distance between the active device and the SOI substrate. Reducing the thickness of the BOX layer in future process nodes may significantly reduce device performance due to artificial harmonics. That is, device performance is degraded by increasing a proximity of the active device and the SOI substrate in future process nodes.

The active devices on the SOI layer may include high performance complementary metal oxide semiconductor (CMOS) transistors. For example, high performance CMOS RF switch technologies are currently manufactured using SOI substrates. An RF front end (RFFE) may rely on these high performance CMOS RF switch technologies for successful operation. A process for fabricating an RFFE, therefore, involves the costly integration of an SOI wafer for supporting these high performance CMOS RF switch technologies. Furthermore, support for future RF performance enhancements involves increased device isolation while reducing RF loss.

One technique for increasing device isolation and reducing RF loss is fabricating an RFFE using SOI wafers. For example, an RF device (e.g., an RF switch device) may include transistors fabricated using an SOI wafer. Unfortunately, transistors fabricated using SOI technology may suffer from the floating body effect. The floating body effect is a phenomenon in which the transistor's body collects charge generated at junctions of the transistor device. In this case, charge that accumulates in the body causes adverse effects, such as parasitic transistors in the structure and off-state leakage. In addition, the accumulated charge also causes dependence of the threshold voltage of the transistor on its previous states. The floating body effect may also generate out-of-band harmonic frequencies, which are detrimental to future communication enhancements.

Various aspects of the present disclosure provide techniques for a body current bypass resistor for improving a breakdown voltage and harmonic performance. The process flow for semiconductor fabrication of the integrated RF circuit may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably.

Aspects of the present disclosure relate to a body current bypass resistor for improving a breakdown voltage and harmonic performance. That is, aspects of the present disclosure employ a negative gate biasing technique, in which a body current bypass resistor isolates a gate from a body current during the biasing operation. According to this aspect of the present disclosure, an RF integrated circuit (RFIC) includes a switch field effect transistor (FET) having a source region, a drain region, a body region, and a gate. The RFIC also includes a body bypass resistor and a reverse biased diode coupled between the gate and the body region of the switch FET. The RFIC further includes a gate isolation resistor coupled between the gate and the body region.

FIG. 1 is a schematic diagram of a wireless device 100 (e.g., a cellular phone or a smartphone) including a body current bypass resistor for improving a breakdown voltage and harmonic performance. The wireless device 100 has a wireless local area network (WLAN) (e.g., WiFi) module 150 and an RF front end module 170 for a chipset 110. The WiFi module 150 includes a first diplexer 160 communicably coupling an antenna 162 to a wireless local area network module (e.g., WLAN module 152). The RF front end module 170 includes the second diplexer 190 communicably coupling an antenna 192 to the wireless transceiver 120 (WTR) through a duplexer 180 (DUP). An RF switch 172 communicably couples the second diplexer 190 to the duplexer 180. The wireless transceiver 120 and the WLAN module 152 of the WiFi module 150 are coupled to a modem (MSM, e.g., a baseband modem) 130 that is powered by a power supply 102 through a power management integrated circuit (PMIC) 140. The chipset 110 also includes capacitors 112 and 114, as well as an inductor(s) 116 to provide signal integrity. The PMIC 140, the modem 130, the wireless transceiver 120, and the WLAN module 152 each include capacitors (e.g., 142, 132, 122, and 154) and operate according to a clock 118. The geometry and arrangement of the various inductor and capacitor components in the chipset 110 may reduce the electromagnetic coupling between the components.

The wireless transceiver 120 of the wireless device generally includes a mobile RF transceiver to transmit and receive data for two-way communication. A mobile RF transceiver may include a transmit section for data transmission and a receive section for data reception. For data transmission, the transmit section may modulate an RF carrier signal with data to obtain a modulated RF signal, amplify the modulated RF signal using a power amplifier (PA) to obtain an amplified RF signal having the proper output power level, and transmit the amplified RF signal via the antenna 192 to a base station. For data reception, the receive section may obtain a received RF signal via the antenna and may amplify the received RF signal using a low noise amplifier (LNA) and process the received RF signal to recover data sent by the base station in a communication signal.

The wireless transceiver 120 may include one or more circuits for amplifying these communication signals. The amplifier circuits (e.g., LNA/PA) may include one or more amplifier stages that may have one or more driver stages and one or more amplifier output stages. Each of the amplifier stages includes one or more transistors configured in various ways to amplify the communication signals. Various options exist for fabricating the transistors that are configured to amplify the communication signals transmitted and received by the wireless transceiver 120.

The wireless transceiver 120 and the RF front end module 170 may be implemented using semiconductor on insulator (SOI) technology for fabricating transistors of the wireless transceiver 120, which helps reduce high order harmonics in the RF front end module 170. SOI technology replaces conventional semiconductor substrates with a layered semiconductor-insulator-semiconductor substrate for reducing parasitic device capacitance and improving performance. SOI-based devices differ from conventional, silicon-built devices because a silicon junction is above an electrical isolator, typically a buried oxide (BOX) layer. A reduced thickness BOX layer, however, may not sufficiently reduce artificial harmonics caused by the proximity of an active device on an SOI layer and an SOI substrate supporting the BOX layer. An active device fabricated using SOI technology is shown in FIG. 2.

Figure 2:
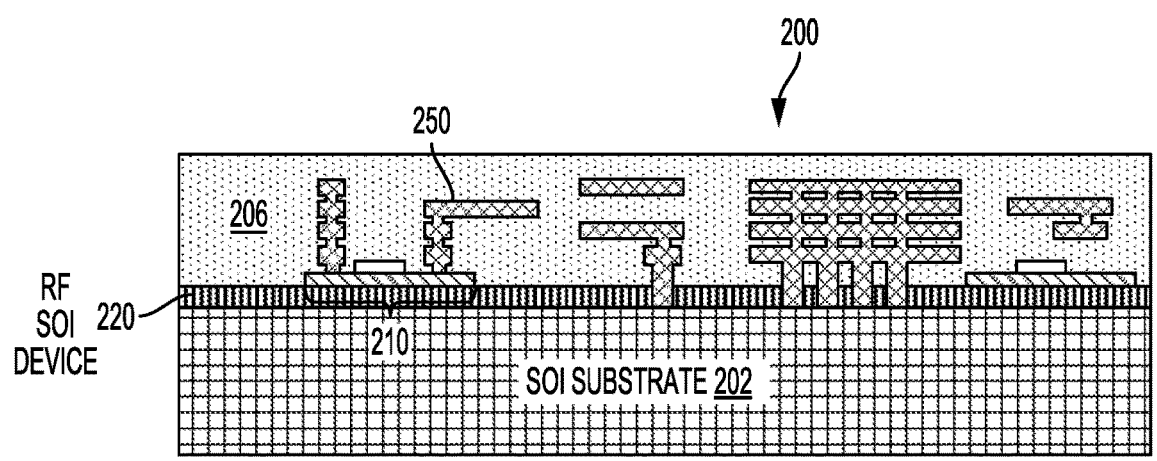
FIG. 2 shows a cross-sectional view of a radio frequency (RF) integrated circuit (RFIC), including an RF silicon on insulator (SOI) device.

FIG. 2 shows a cross-sectional view of a radio frequency (RF) integrated circuit (RFIC) 200. As shown in FIG. 2, an RF silicon on insulator (SOI) device includes an active device 210 on a buried oxide (BOX) layer 220 supported by an SOI substrate 202 (e.g., a silicon wafer). The RF SOI device may be fabricated as a complementary metal oxide semiconductor (CMOS) transistor using a CMOS process. The RF SOI device also includes interconnects 250 coupled to the active device 210 within a first dielectric layer 206. In this configuration, a parasitic capacitance of the RF SOI device is proportional to a thickness of the BOX layer 220, which determines the distance between the active device 210 and the SOI substrate 202.

The active device 210 on the BOX layer 220 may be a CMOS transistor. For example, high performance CMOS RF switch technologies are currently manufactured using SOI substrates. The RFFE 170 (FIG. 1) may rely on these high performance CMOS RF technologies for successful operation. A process for fabricating the RFFE 170, therefore, involves integration of an SOI wafer to support these high performance CMOS RF technologies. Furthermore, support for future RF performance enhancements involves increased device isolation while reducing RF loss. The RF integrated circuit 200 may be used to implement the RFFE 170 in FIG. 1. For example, the active device 210 may be a switch field effect transistor (FET) of the RF switch 172 of the RFFE 170.

The configuration of the RF integrated circuit 200 increases device isolation and reduces RF loss by using an SOI wafer for implementing the RFFE 170. Unfortunately, because the RF integrated circuit 200 is fabricated using SOI technology, the active device 210 may suffer from the floating body effect. The floating body effect is a phenomenon in which the transistor's body collects charge generated at the junctions of the transistor device. Charge that accumulates in the body causes adverse effects, such as parasitic transistors in the structure and off-state leakage (e.g., a gate induced drain leakage (GIDL) current). In addition, the accumulated charge also causes dependence of the threshold voltage of the transistor on its previous states. The floating body effect may also generate undesired, out-of-band harmonic frequencies, which are detrimental to communication enhancements integrated within the RFFE 170.

During an off state, the active device 210 (e.g., a switch field effect transistor (FET)) isolates the RF integrated circuit from an input power (Pin). Isolation of the input power Pin by the active device 210 is increased by negatively biasing a gate of the active device 210, for hard turn-off of the active device 210. Unfortunately, negatively biasing the gate of the active device 210 may significantly increase a gate-to-drain voltage (Vgd) of the active device 210. The high gate-to-drain voltage Vgd triggers a gate induced drain leakage (GIDL) current, causing positive charge to accumulate in a body of the active device 210. That is, a high potential difference between the gate and the drain of the switch FET causes the GIDL current.

Furthermore, when an RF signal is received at the drain of the active device 210, that is in the biased in off-state, the transmission of the RF signal may be corrupted along the intended path if the active device 210 is not fully isolated. For example, if the gate of the active device 210 fails to isolate the RF signal from, for example, a power supply coupled to the active device 210, the RF signal is significantly corrupted. Isolating the RF signal (e.g., the gate) from a power supply may be referred to as RF isolation.

Current switch products may include a body contact for extracting the accumulated charge in the body of the switch transistor by biasing the body contact of the switch FET (e.g., the active device 210) independently from the gate of the switch FET. In addition, resistors may be used for RF isolating the gate of the switch FET from the power supply. While these techniques provide RF isolation, biasing the body independently from biasing the gate of the switch FET causes the body to move independently from the gate. This independent movement of the body may generate undesired out-of-band harmonics. Furthermore, separately biasing the gate and the body may involve separate charge pumps for providing external gate and body voltages. Using separate charge pumps, however, consumes significant chip area of the RF integrated circuit 200.

One technique for preventing independent movement of the body involves tying the body contact to the gate of the switch FET using a diode. In addition, an external resistor may be coupled to a node of a gate-to-body tie for providing RF isolation of the gate from the power supply for protecting RF signals. While the external resistor provides RF isolation, a voltage drop across the external resistor (e.g., due to the body current Ib) may reduce a voltage at the gate of the switch FET. This reduced gate voltage (Vg) reduces negative biasing of the gate, resulting in gate de-biasing of the switch FET. Gate de-biasing of the switch FET prevents the gate from isolating the switch FET from the input power Pin.

Reducing the gate voltage Vg also reduces a breakdown voltage of the switch FET because the breakdown voltage is a function of the gate voltage Vg. That is, the gate voltage Vg is negatively affected by the body current Ib of the switch FET due to the voltage drop across the external resistor. As noted above, the body current Ib is based on a magnitude of the input power Pin at the gate of the switch FET. As a result, the maximum breakdown voltage of the switch FET is limited by the body current Ib of the switch FET because the body current substantially reduces the gate voltage Vg.

Figure 3:
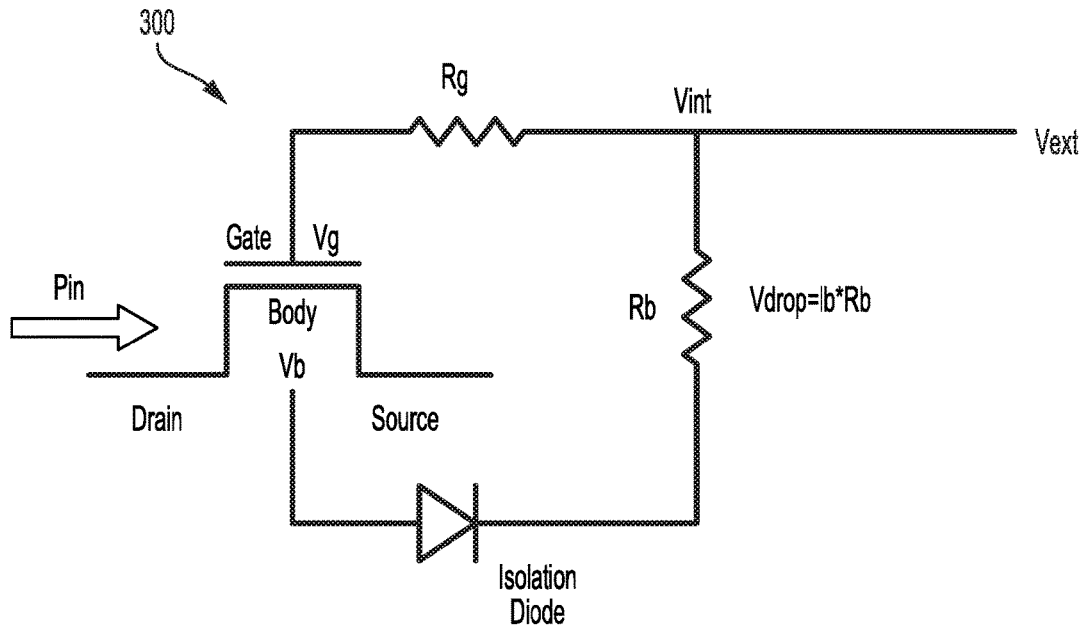
FIG. 3 is a schematic diagram illustrating a switch field effect transistor (FET) including a body current bypass resistor for improving a breakdown voltage and harmonic performance, according to aspects of the present disclosure.

FIG. 3 is a schematic diagram illustrating a switch field effect transistor (FET) including a body current bypass resistor for improving a breakdown voltage and harmonic performance, according to aspects of the present disclosure. In this configuration, an isolation diode is used for tying a body with a gate of a switch FET 300. According to aspects of the present disclosure, the switch FET 300 does not include an external resistor for isolating the switch FET 300 from a power supply, which may be electrically coupled to an external voltage (Vext) node. Eliminating the external resistor may prevent de-biasing of the gate of the switch FET 300. Eliminating the external resistor causes an internal gate voltage (Vgint) node to equal an external voltage (Vext) of the switch FET 300.

In this configuration, a body bypass resistor (Rb) is coupled between the body and the gate of the switch FET 300. In this example, the isolation diode is electrically coupled between the body bypass resistor Rb and the body of the switch FET 300. A resistance of the body bypass resistor Rb may be reduced for allowing a charge to escape from the body of the switch FET 300. The small body bypass resistor Rb provides RF isolation of the body by allowing charge to escape from the body through the isolation diode, without de-biasing the gate, due to an increased body voltage (Vb). In addition, further preventing of gate de-biasing may be achieved by electrically coupling a gate isolation resistor (Rg) between the body bypass resistor Rb and the gate of the switch FET 300.

Figure 4:
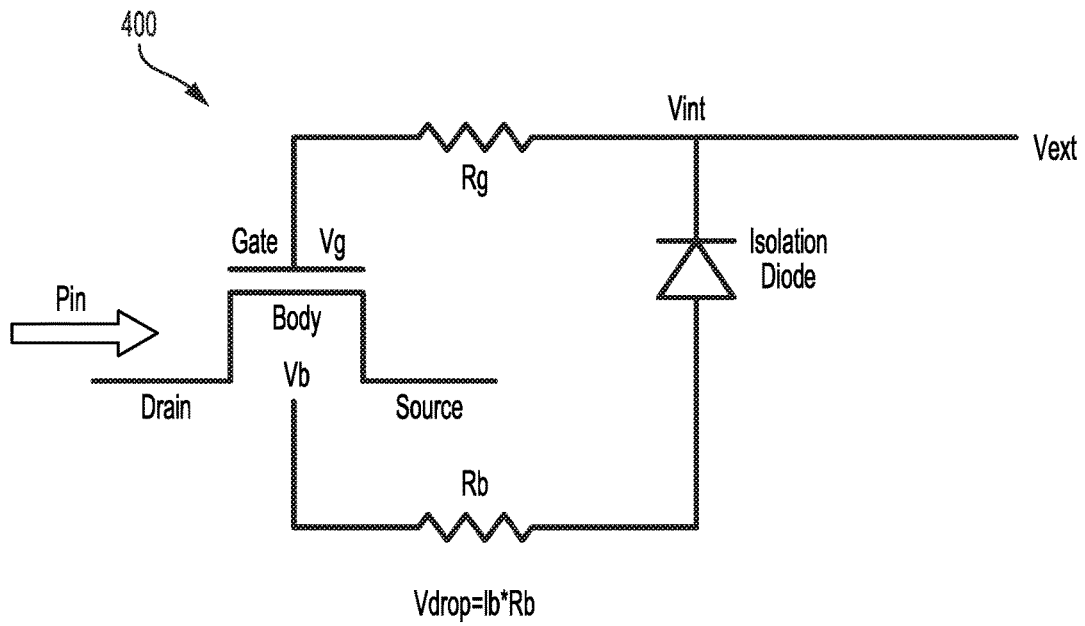
FIG. 4 is a schematic diagram illustrating a switch field effect transistor (FET) including a body current bypass resistor for further improving a breakdown voltage and harmonic performance, according to further aspects of the present disclosure.

FIG. 4 is a schematic diagram illustrating a switch field effect transistor (FET) 400 including a body current bypass resistor for further improving a breakdown voltage and harmonic performance, according to aspects of the present disclosure. Representatively, a gate isolation resistor (Rg) is electrically coupled between an internal voltage (Vint) node and a gate of the switch FET 400. In addition, a body bypass resistor (Rb) is electrically coupled between an isolation diode and a body of the switch FET 400. In this example, the isolation diode and the gate isolation resistor Rg are both electrically coupled to the Vint node of the switch FET 400.

In the configuration shown in FIG. 4, a resistance of the gate isolation resistor Rg is greater than or equal to the resistance of the body bypass resistor Rb. In aspects of the present disclosure, a size of the gate isolation resistor Rg is selected to tune the switching time of the switch FET 400. In addition, a resistance of the body bypass resistor Rb may be reduced for allowing charge to escape from the body of the switch FET 400. The small body bypass resistor Rb provides RF isolation of the body and simultaneously allows a regulated GIDL current to flow through the isolation diode and out to an external voltage (Vext) node, without de-biasing the gate.

In this aspect of the present disclosure, the isolation diode electrically couples the gate and body nodes of the switch FET 400 for ensuring high linearity. In addition, the internal voltage Vint as well as the external voltage Vext are determined according to a voltage drop (Vdrop) across the body bypass resistor Rb (Vdrop=Ib*Rb). A switching time of the switch FET 400 is tuned according to the gate isolation resistor Rg, independently from the body bypass resistor Rb, and without impacting the gate voltage Vg. In addition, this configuration of the switch FET 400 supports a single charge pump, which saves significant semiconductor chip area.

Figure 5:
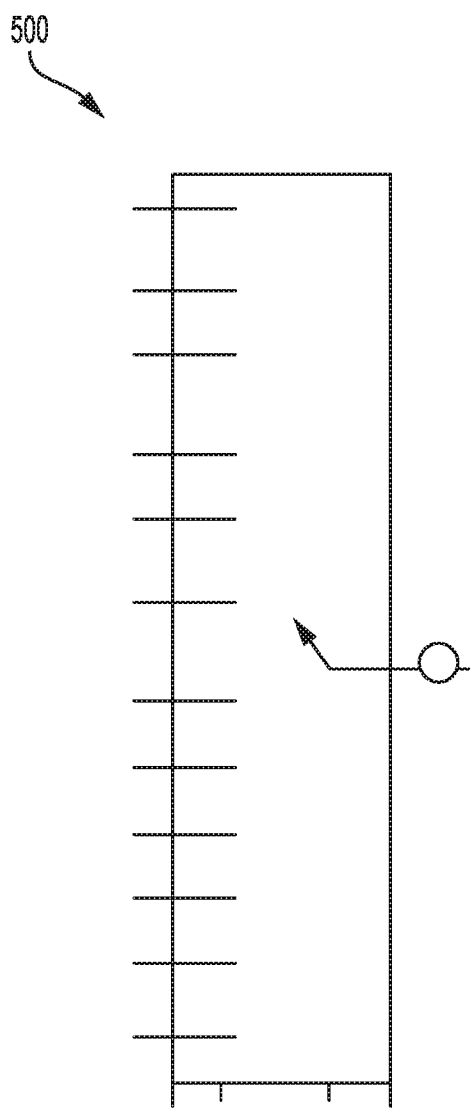
FIG. 5 is a schematic diagram illustrating a switch product including a set of the switch FETs of FIGS. 3 and 4, according to further aspects of the present disclosure.

FIG. 5 is a schematic diagram illustrating a switch product 500 including the switch FET 300, 400 of FIGS. 3 and 4, according to further aspects of the present disclosure. In a shunt condition (when the switch is open), a switch transistor gate of the switch product 500 is negatively biased. The negative bias causes a hard turn-off condition for preventing an input RF signal (e.g., the input power Pin) from traversing between a drain and a source of the switch transistor. Although described with reference to a semiconductor on insulator (SOI) wafer, it should be recognized that the switch product 500 is not limited to an SOI wafer and may be fabricated using a bulk semiconductor wafer.

Unfortunately, when a negative bias is applied at the switch transistor gate, the gate-to-drain voltage (Vgd) is substantially increased. The increased Vgd voltage triggers a gate induced drain leakage (GIDL) current. This GIDL current de-biases the gate if the gate and body of the switch transistor are coupled together behind a single external resistor. In aspects of the present disclosure, the switch product includes a switch transistor with a small body bypass resistor (Rb) and an isolation gate resistor coupled through a diode. This allows charge to escape from the body without de-biasing the gate of the switch transistor, for example, as shown in FIG. 4.

Various aspects of the present disclosure provide techniques for improving a breakdown voltage and harmonic performance of a switch, by using a body current bypass resistor, as shown in FIGS. 3 and 4. One aspect of the present disclosure uses a gate isolation resistor (Rg) and a body bypass resistor (Rb) for protecting an RF integrated circuit 300/400 during a negative biasing operation, for example, as shown in FIGS. 3 and 4. A resistance of the gate isolation resistor Rg may be greater than the resistance of the body bypass resistor Rb for diverting a body current (Ib). A method of constructing an RFIC having a body current bypass resistor, according to aspects of the present disclosure, is shown in FIG. 6.

Figure 6:
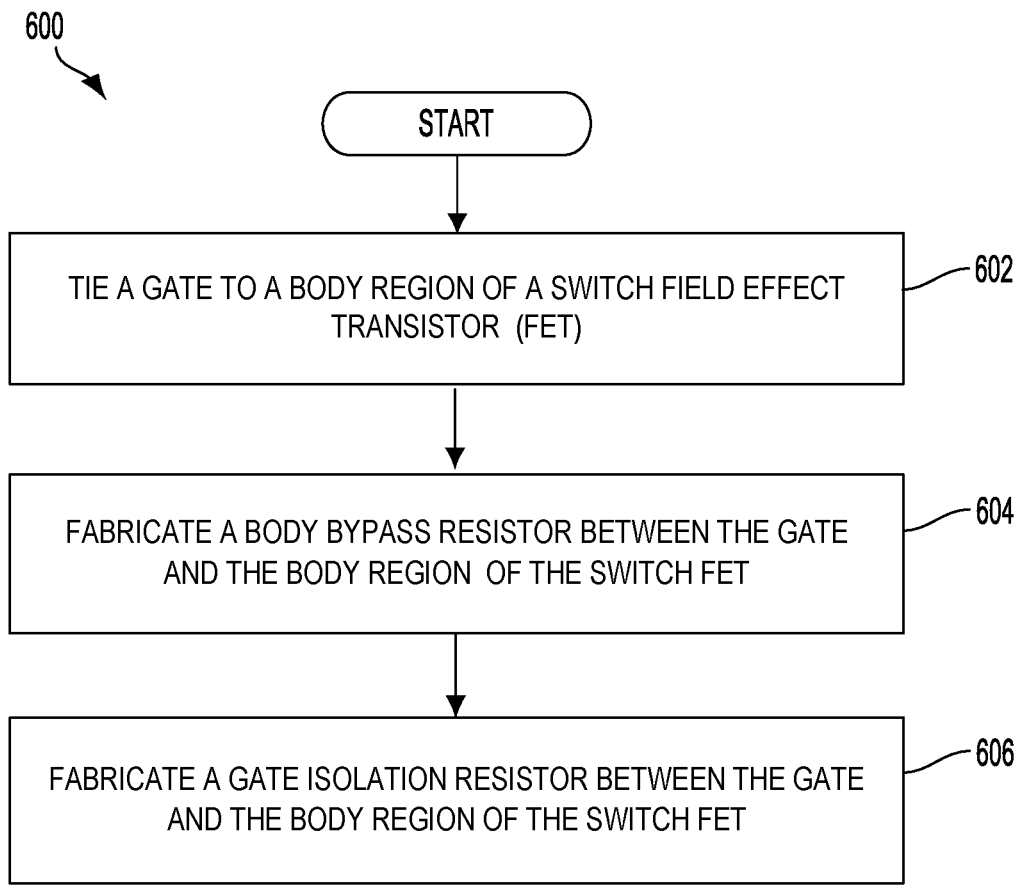
FIG. 6 is a process flow diagram illustrating a method of constructing an radio frequency (RF) integrated circuit (RFIC) having a body current bypass resistor according to aspects of the present disclosure.

FIG. 6 is a process flow diagram illustrating a method for constructing a radio frequency (RF) integrated circuit (RFIC) having a body current bypass resistor, according to an aspect of the present disclosure. A method 600 begins in block 602, in which a gate is tied to a body region of a switch field effect transistor (FET). For example, as shown in FIGS. 3 and 4, the gate is tied to the body of the switch FET 300/400. In block 604, a body bypass resistor is fabricated between the gate and the body region of the switch FET. For example, as shown in FIGS. 3 and 4, the body bypass resistor Rb is coupled between the body region and the gate.

As further shown in FIG. 6, in block 606, a gate isolation resistor is fabricated between the gate and the body region of the switch FET. For example, as shown in FIGS. 3 and 4, the gate isolation resistor Rg is coupled between the body bypass resistor Rb and the gate of the switch FET 300/400. The method 600 may further include fabricating an isolation diode coupled between the body bypass resistor Rb and the gate isolation resistor Rg, for example, as shown in FIG. 4. Alternatively, the method 600 may further include fabricating an isolation diode coupled between the body bypass resistor Rb and the body region, for example, as shown in FIG. 3.

Aspects of the present disclosure employ a negative gate biasing technique for isolating a switch FET from an input signal. A body current bypass resistor isolates a gate from a body current during the biasing operation. This negative bias creates a gate induced drain leakage (GIDL) current that causes charge to build up in a body region of the switch FET when fabricated using an SOI wafer. This aspect of present disclosure modifies a conventional body to gate diode implementation for improving device performance. In this aspect of the present disclosure, the switch FET includes a body bypass resistor and a reverse biased diode coupled between a gate and a body region of the switch FET. The switch FET also includes a gate isolation resistor coupled between the gate and the body region.

According to a further aspect of the present disclosure, an RF integrated circuit, including a switch FET, is described. The switch FET includes means for directing a body current away from a body of the switch FET. The directing means may be the body bypass resistor, shown in FIGS. 3 and 4. The switch FET includes means for isolating a gate of the switch FET from the body current. The isolating means may be the gate isolation resistor, shown in FIGS. 3 and 4. In another aspect, the aforementioned means may be any module or any apparatus configured to perform the functions recited by the aforementioned means.

Figure 7:
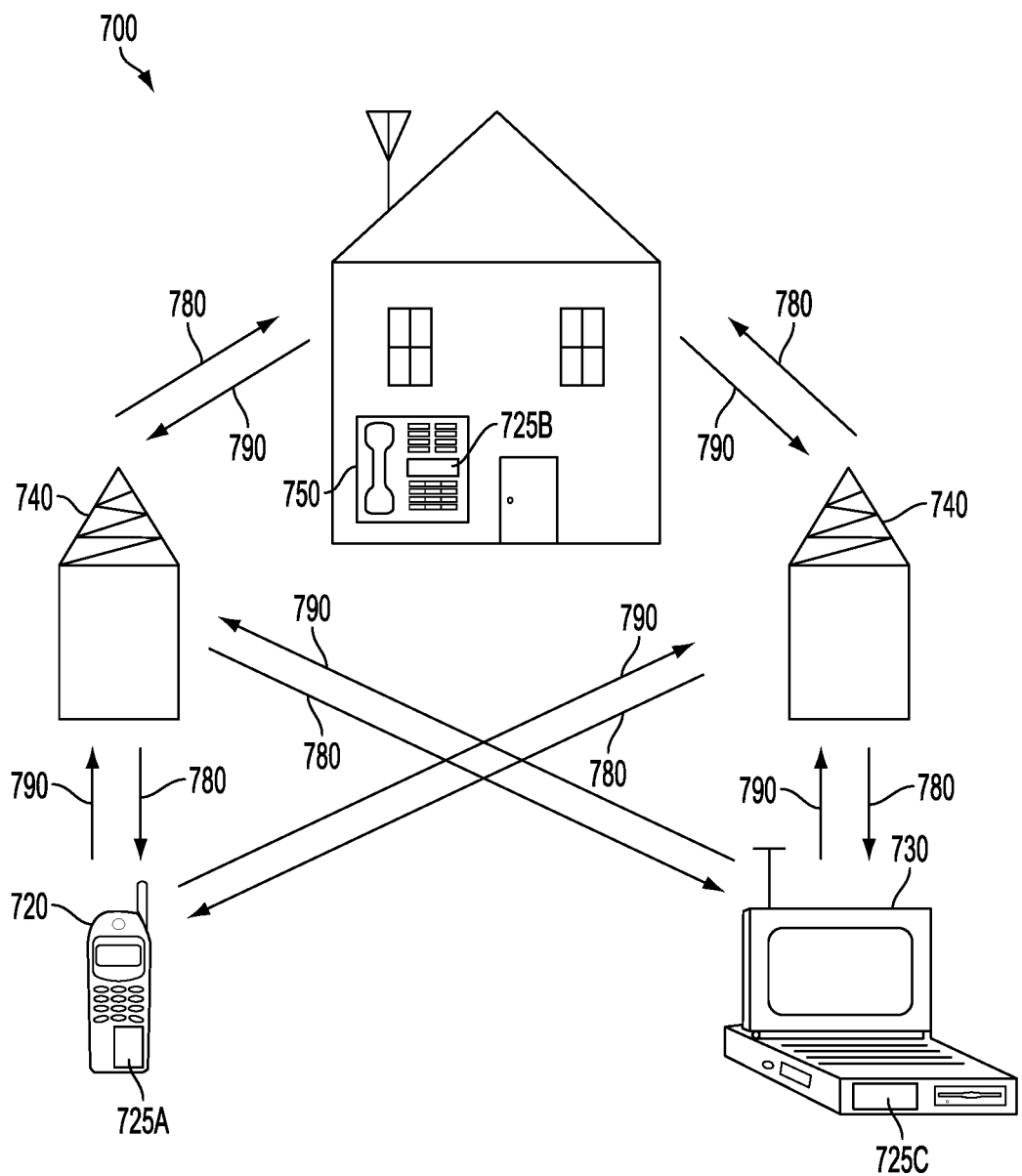
FIG. 7 is a block diagram showing an exemplary wireless communication system in which a configuration of the present disclosure may be advantageously employed.

FIG. 7 is a block diagram showing an exemplary wireless communication system 700 in which an aspect of the present disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed RFIC. It will be recognized that other devices may also include the disclosed RFIC, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units, according to the aspects of the present disclosure, the present disclosure is not limited to these exemplary illustrated units. Aspects of the present disclosure may be suitably employed in many devices, which include the disclosed RFIC.

Figure 8:
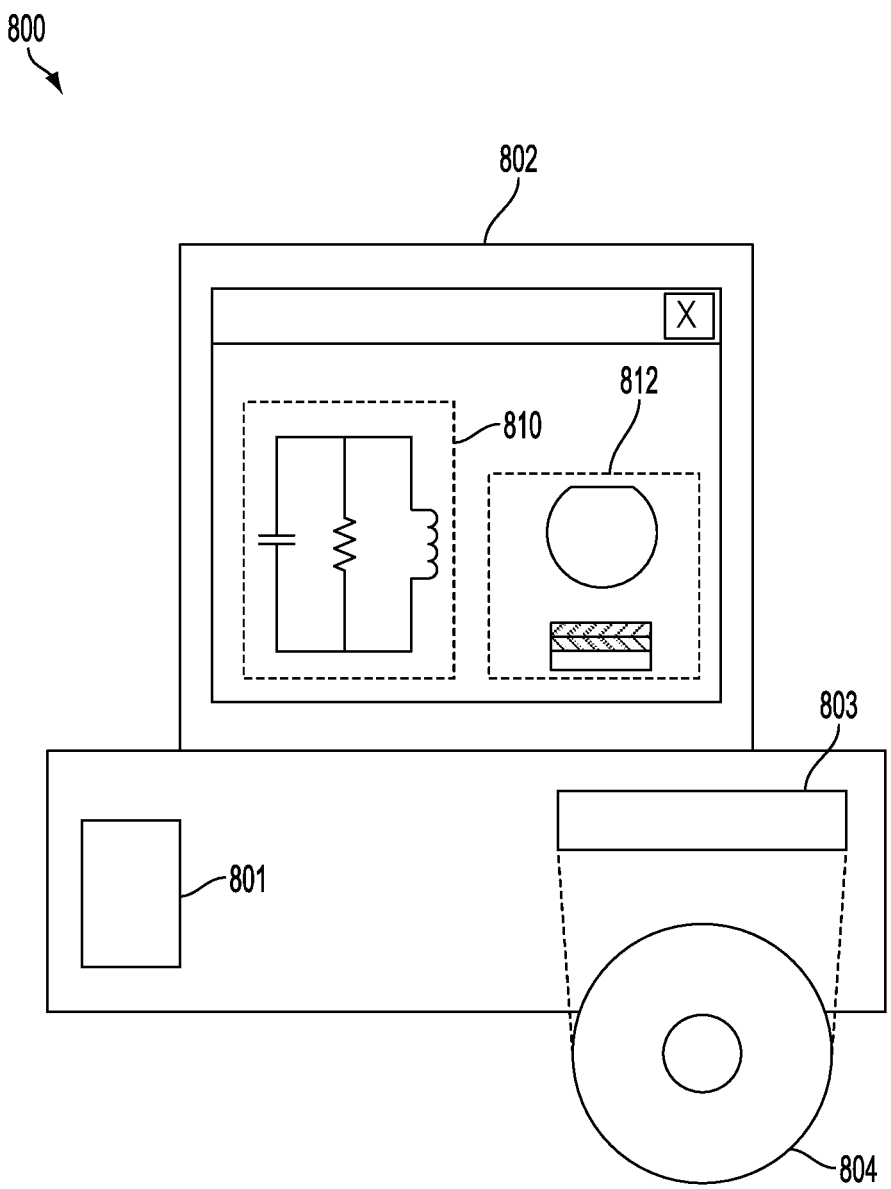
FIG. 8 is a block diagram illustrating a design workstation used for circuit, layout, and logic design of a semiconductor component, according to one configuration.

FIG. 8 is a block diagram illustrating a design workstation used for circuit, layout, and logic design of a semiconductor component, such as the RF devices disclosed above. A design workstation 800 includes a hard disk 801 containing operating system software, support files, and design software such as Cadence or OrCAD. The design workstation 800 also includes a display 802 to facilitate a circuit design 810 or an RFIC 812. A storage medium 804 is provided for tangibly storing the circuit design 810 or the RFIC 812. The circuit design 810 or the RFIC 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the RFIC 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized, according to the present disclosure. Accordingly, the appended claims are intended to include within their scope such processes, machines, manufacture, compositions of matter, means, methods, or steps.

What is claimed is:

1. A radio frequency integrated circuit (RFIC), comprising:
   a switch field effect transistor (FET) including a source region, a drain region, a body region, and a gate;
   a body bypass resistor coupled between an internal voltage (Vint) node and the body region;
   a gate isolation resistor coupled between the gate and the internal voltage (Vint) node, a resistance of the gate isolation resistor being greater than a resistance of the body bypass resistor; and
   a diode coupled between the body bypass resistor and the gate isolation resistor.

2. The RFIC of claim 1, in which an internal voltage (Vint) equals an external voltage (Vext) of the switch FET.

3. The RFIC of claim 1, in which the body bypass resistor, the diode and the gate isolation resistor are coupled in series between the body region and the gate of the switch FET.

4. The RFIC of claim 1, in which the switch FET comprises a complementary metal oxide semiconductor (CMOS) transistor on a semiconductor on insulator (SOI) device.

5. The RFIC of claim 1, in which the body bypass resistor and the diode are coupled in series between the body region and an internal gate voltage (Vgint) node of the switch FET.

6. The RFIC of claim 5, further comprising a charge pump electrically coupled to the internal gate voltage (Vgint) node of the switch FET.

7. The RFIC of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

8. A method of constructing an radio frequency (RF) integrated circuit having a switch field effect transistor (FET), comprising:
   tying a gate to a body region of the switch FET;
   fabricating a body bypass resistor between an internal voltage (Vint) node and the body region; and
   fabricating a gate isolation resistor between the gate and the internal voltage (Vint) node, a resistance of the gate isolation resistor being greater than a resistance of the body bypass resistor.

9. The method of claim 8, further comprising fabricating an isolation diode coupled between the body bypass resistor and the gate isolation resistor.

10. The method of claim 8, further comprising fabricating an isolation diode coupled between the body bypass resistor and the body region.

11. The method of claim 8, further comprising integrating the switch FET into an RF front end module, the RF front end module incorporated into at least one of a music player, a video player, an entertainment unit, a navigation device, a communications device, a personal digital assistant (PDA), a fixed location data unit, a mobile phone, and a portable computer.

12. A radio frequency integrated circuit (RFIC), comprising:
   a switch field effect transistor (FET) including a source region, a drain region, a body region, and a gate, in which the body region is tied to the gate;
   means for isolating the gate from a body current of the body region;
   means for directing the body current from the body region away from the gate of the switch FET, a resistance of the directing means having a lower value than a resistance of the isolating means; and
   a diode coupled between the means for isolating and the means for directing.

13. The RFIC of claim 12, in which an internal voltage (Vint) equals an external voltage (Vext) of the switch FET.

14. The RFIC of claim 12, in which the means for isolating, the diode, and the means for directing are coupled in series between the body region and the gate of the switch FET.

15. The RFIC of claim 12, in which the switch FET comprises a complementary metal oxide semiconductor (CMOS) transistor having a semiconductor on insulator (SOI) wafer.

16. The RFIC of claim 12, in which the means for directing and the diode are coupled in series between the body region and an internal gate voltage (Vgint) node of the switch FET.

17. The RFIC of claim 16, further comprising a charge pump electrically coupled to the internal gate voltage (Vgint) node of the switch FET.

18. The RFIC of claim 12, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

* * * * *